United States Patent
Inatomi et al.

(10) Patent No.: US 8,691,497 B2
(45) Date of Patent: Apr. 8, 2014

(54) DEVELOPING TREATMENT METHOD

(75) Inventors: Yuichiro Inatomi, Nirasaki (JP);
Mitsuaki Iwashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 13/499,362

(22) PCT Filed: Aug. 20, 2010

(86) PCT No.: PCT/JP2010/064038
§ 371 (c)(1),
(2), (4) Date: Mar. 30, 2012

(87) PCT Pub. No.: WO2011/040140
PCT Pub. Date: Apr. 7, 2011

(65) Prior Publication Data
US 2012/0183909 A1    Jul. 19, 2012

(30) Foreign Application Priority Data
Oct. 2, 2009    (JP) .................................. 2009-230642

(51) Int. Cl.
*G03F 7/40*    (2006.01)
(52) U.S. Cl.
USPC .......................................... 430/331; 430/432
(58) Field of Classification Search
USPC .................................................. 430/331, 432
See application file for complete search history.

(56) References Cited

U.S. PATENT DOCUMENTS

| | | | | |
|---|---|---|---|---|
| 5,726,107 | A | * | 3/1998 | Dahringer et al. ............ 442/414 |
| 2008/0008973 | A1 | * | 1/2008 | Goto et al. .................... 430/432 |
| 2010/0028803 | A1 | * | 2/2010 | Sugimoto et al. .......... 430/270.1 |

FOREIGN PATENT DOCUMENTS

| | | |
|---|---|---|
| JP | A-07-142349 | 6/1995 |
| JP | A-2003-109897 | 4/2003 |
| JP | A-2003-178943 | 6/2003 |
| JP | A-2003-178944 | 6/2003 |
| JP | A-2005-338609 | 12/2005 |
| JP | 2009-016657 A | 1/2009 |
| WO | WO 2005/103832 | 11/2005 |

OTHER PUBLICATIONS

International Search Report mailed Nov. 22, 2010 in corresponding International Application No. PCT/JP2010/064038 (English enclosed).

* cited by examiner

*Primary Examiner* — Anca Eoff
(74) *Attorney, Agent, or Firm* — Posz Law Group, PLC

(57) ABSTRACT

A developing treatment method includes: a treatment solution supplying step of supplying a treatment solution made by diluting a hydrophobizing agent hydrophobizing a resist pattern with hydrofluoroether onto a substrate on which a rinse solution has been supplied after development of the resist pattern; a hydrophobic treatment stabilizing step of stabilizing a hydrophobic treatment of the resist pattern with the supply of the treatment solution stopped and rotation of the substrate almost stopped; and a treatment solution removing step of removing the treatment solution from a top of the substrate on which the treatment solution has been supplied. The hydrophobizing agent is trimethylsilyldimethyl-amine.

12 Claims, 14 Drawing Sheets

DEVELOPING TREATMENT METHOD

TECHNICAL FIELD

The present invention relates to a developing treatment method of performing a developing treatment on a substrate on which a resist has been applied and subjected to exposure treatment.

BACKGROUND ART

In a photolithography process in manufacture of a semiconductor device, a photoresist is applied to the surface of a semiconductor substrate (hereinafter, referred to as a "substrate" or "wafer"), a mask pattern is exposed on the resist and developed to form a resist pattern on the surface of the wafer.

In such a photolithography process, the developing treatment is performed, for example, by the method of puddle-type, dip type or the like. For example, the puddle type method supplies a developing solution to the wafer, whereas the dip-type method immerses the wafer into a developing solution to promote the developing treatment. Thereafter, a rinse solution as a cleaning solution using pure water or the like is supplied onto the wafer to wash away the developing solution. Then, a drying treatment is finally performed by air blow, rotation of the wafer or the like in order to remove the rinse solution from the wafer.

On the other hand, miniaturization of the semiconductor device is further advancing in recent years and a resist pattern which is fine and has a high aspect ratio emerges. In such a resist pattern which is fine and has a high aspect ratio, for example, a problem of a so-called "pattern collapse" arises due to generation of an attraction force between patterns by the surface tension of the rinse solution when the rinse solution flows out between the patterns in the drying treatment. In order to prevent the pattern collapse, there is a developing treatment method of supplying an organic solvent with a surface tension lower than that of the rinse solution onto the substrate before the drying treatment.

For example, in order to prevent the pattern collapse when removing the rinse solution, there is a developing treatment method of supplying a rinse solution onto the substrate on which the resist pattern has been developed and supplying a treatment solution containing an organic solvent containing fluorine onto the substrate on which the rinse solution has been supplied (see, for example, Patent Document 1).

PRIOR ART DOCUMENT

Patent Document

[Patent Document 1] Japanese Laid-open Patent Publication No. 2003-17894

DISCLOSURE OF THE INVENTION

Problems to be Solved by the Invention

However, there is a following problem when supplying the treatment solution containing the organic solvent containing fluorine onto the substrate on which the rinse solution has been supplied in order to prevent the pattern collapse when removing the rinse solution.

As a next generation exposure technology, EUV (Extra Ultra-Violet) exposure is under development, and the resist pattern is increasingly miniaturized. Furthermore, in order to perform etching using the miniaturized resist pattern as a mask to transfer the resist pattern to a film to be etched existing under the resist pattern, the height of the resist pattern is sometimes increased to be larger than that at present according to the etching condition. If the height of the resist pattern is increased, the pattern collapse may occur when water flows out between the resist patterns depending on the relation between the surface tension of pure water and the contact angle of the pure water with respect to the resist pattern during the drying treatment after the development and rinsing.

The present invention has been made in consideration of the above points, and provides a developing treatment method capable of preventing the pattern collapse when removing a rinse solution on a substrate even when a resist pattern is further miniaturized and its height is increased.

Means for Solving the Problems

To solve the above problem, the present invention is characterized by devising the following means.

According to an embodiment of the present invention, there is provided a developing treatment method including: a treatment solution supplying step of supplying a treatment solution made by diluting a hydrophobizing agent hydrophobizing a resist pattern with hydrofluoroether onto a substrate on which a rinse solution has been supplied after development of the resist pattern; and a treatment solution removing step of removing the treatment solution from a top of the substrate on which the treatment solution has been supplied.

Effect of the Invention

According to the present invention, pattern collapse can be prevented when removing the rinse solution on the substrate even if the resist pattern is miniaturized and its height is increased.

BEST MODE FOR CARRYING OUT THE INVENTION

Hereinafter, an embodiment of the present invention will be described based on the drawings.

Figure 1:
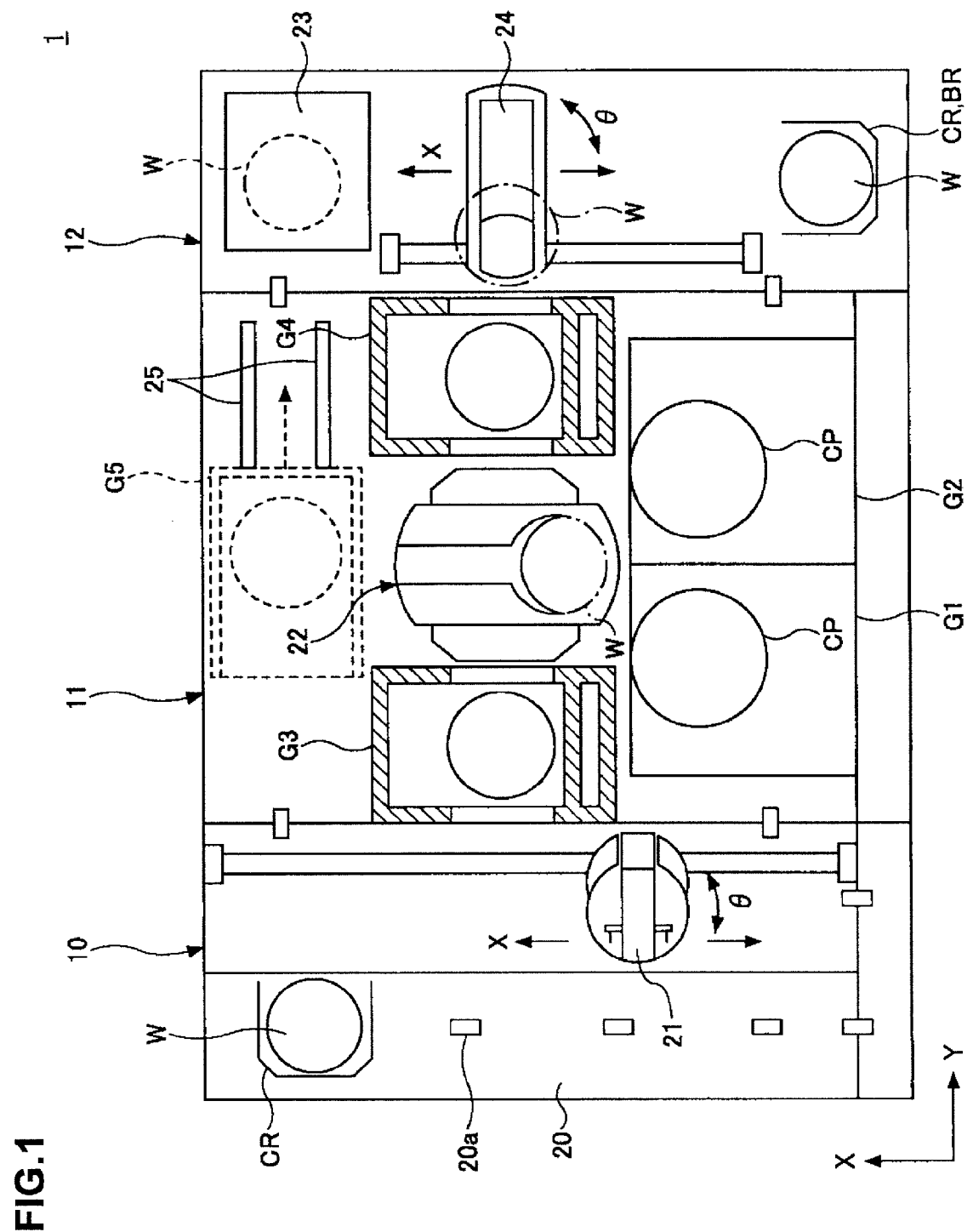
FIG. 1 A plan view of a coating and developing treatment system according to an embodiment of the present invention.
Figure 2:
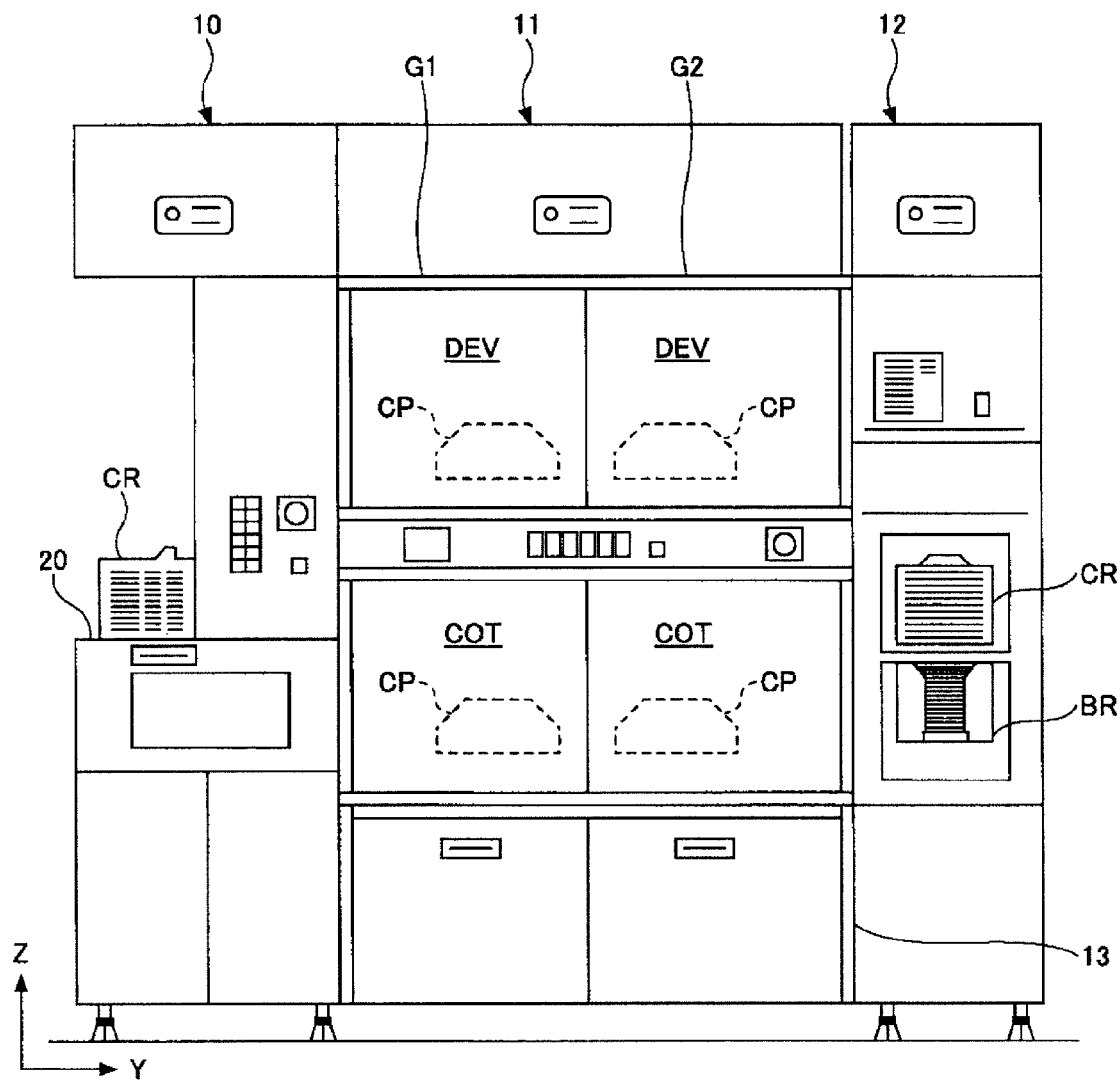
FIG. 2 A front view of the coating and developing treatment system illustrated in FIG. 1.
Figure 3:
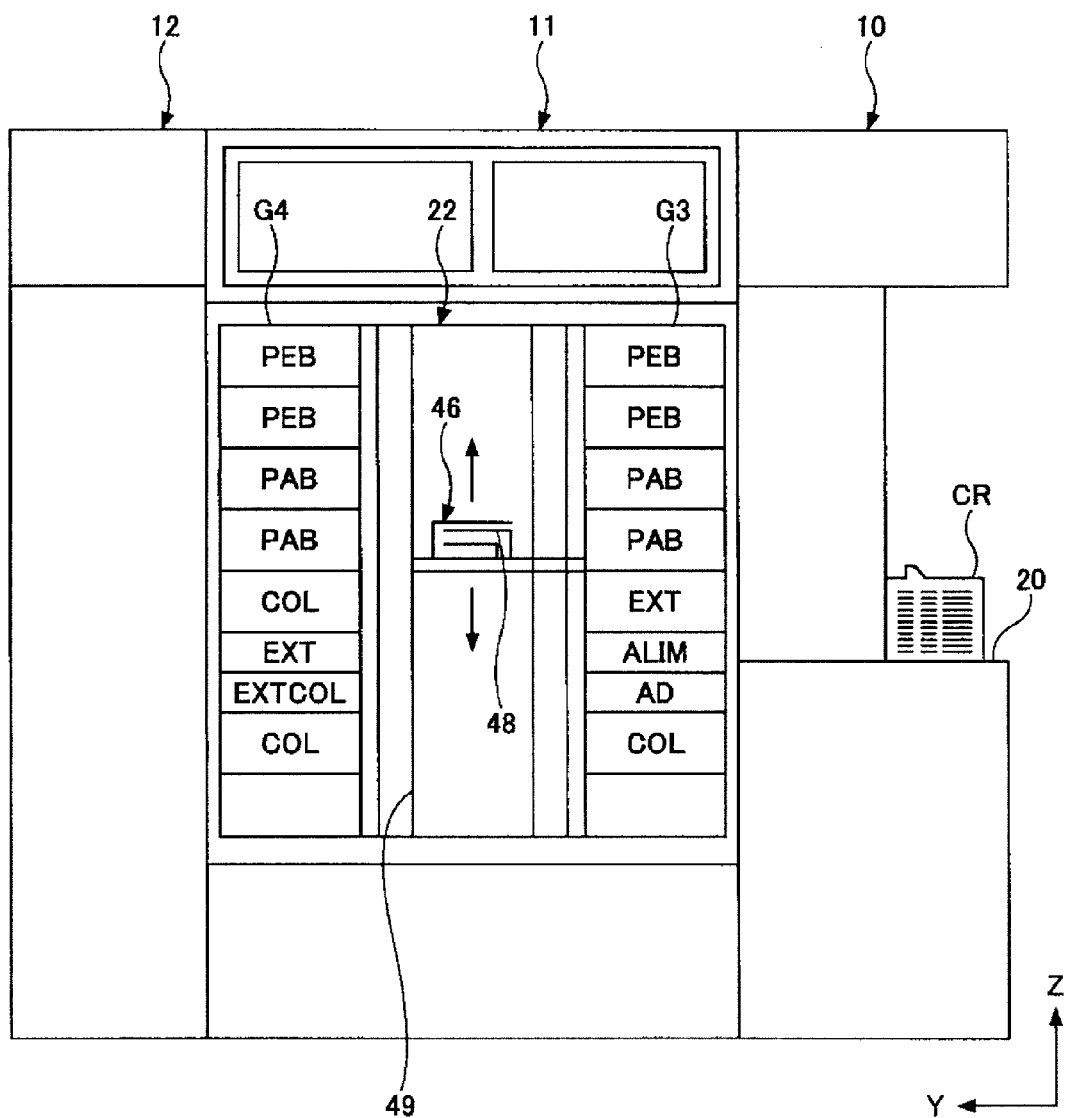
FIG. 3 A rear view of the coating and developing treatment system illustrated in FIG. 1.

FIG. 1 to FIG. 3 are views illustrating the entire configuration of a coating and developing treatment system according to the present invention, FIG. 1 is a plan view thereof, FIG. 2 is a front view, and FIG. 3 is a rear view.

A coating and developing treatment system 1 has a configuration in which a cassette station 10, a treatment station 11, and an interface section 12 are integrally connected. The cassette station 10 transfers a plurality of, for example, 25 semiconductor wafers W as substrates to be treated per cassette CR as a unit to/from the system from/to the outside. The cassette station 10 further transfers the wafers W into/out of the cassette CR. The treatment station 11 is composed of various kinds of single-wafer treatment units multi-tiered at predetermined positions each of which performs a predetermined treatment on the wafers W one by one in a coating and developing process. The interface section 12 delivers the wafers W between the treatment station 11 and an exposure apparatus (not illustrated) provided adjacent to the treatment station 11.

The cassette station 10 has, as illustrated in FIG. 1, a cassette mounting table 20 and a wafer transfer body 21. On the cassette mounting table 20, a plurality of, for example, up to four cassettes CR are mounted at positions of projections 20a on the cassette mounting table 20 in a line in an X-direction with their wafer ports directed to the treatment station 11 side. The wafer transfer body 21 is provided to be movable in a cassette arrangement direction (the X-direction) and in a wafer arrangement direction (a Z-direction) of wafers housed in the cassette CR. The wafer transfer body 21 is also configured to selectively access each of the wafer cassettes CR. Further, the wafer transfer body 21 is configured to be rotatable in a θ-direction to be accessible also to an alignment unit (ALIM) and an extension unit (EXT) included in a multi-tiered unit section of a third group G3 on the treatment station 11 side as will be described later.

In the treatment station 11, a vertical transfer-type main wafer transfer mechanism 22 is provided at the center portion and all of the treatment units are arranged in multiple tiers in one group or a plurality of groups around the main wafer transfer mechanism 22 as illustrated in FIG. 1. In this example, the configuration is a multiple-tier arrangement of five groups G1, G2, G3, G4, G5. The multi-tiered units in the first and second groups G1, G2 are arranged side by side on the system front (the near in FIG. 1) side. The multi-tiered units in the third group G3 are arranged adjacent to the cassette station 10. The multi-tiered units in the fourth group G4 are arranged adjacent to the interface section 12. The multi-tiered units in the fifth group G5 are arranged on the rear side.

Note that the fifth group G5 is configured to be movable along rails 25 for maintenance of the main wafer transfer mechanism 22.

As illustrated in FIG. 3, the main wafer transfer mechanism 22 is equipped with a wafer transfer device 46 which freely moves up and down in the vertical direction (the Z-direction). A cylindrical support body 49 is connected to the rotation shaft of a motor (not illustrated), and rotates together with the wafer transfer device 46 about the rotation shaft by a rotation driving force of the motor. Accordingly, the wafer transfer device 46 freely rotates in the θ-direction. The wafer transfer device 46 has a transfer arm 48.

As illustrated in FIG. 2, in the first group G1, two spinner-type treatment units each performing a predetermined treatment while the wafer W is mounted on a spin chuck in a cup CP, for example, a resist coating treatment unit (COT) and a developing treatment unit (DEV) according to the present invention are two-tiered in order from the bottom. Also in the second group G2, two spinner-type treatment units, for example, a resist coating treatment unit (COT) and a developing treatment unit (DEV) are two-tiered in order from the bottom. It is preferable to dispose the resist coating treatment unit (COT) at the lower tier as described above because drainage of the resist solution is troublesome in terms of mechanism and maintenance. However, it is also possible to dispose the resist coating treatment unit (COT) at the upper tier if necessary.

Note that a chemical chamber 13 for supplying various kinds of treatment solutions to the resist coating treatment unit (COT) and the developing treatment unit (DEV) may be provided in an empty space on the lower side in the Z-direction in the first group G1 and the second group G2.

As illustrated in FIG. 3, in the third group G3, oven-type treatment units each performing a predetermined treatment with the wafer W mounted on a mounting table, such as a cooling unit (COL), an adhesion unit (AD), an alignment unit (ALIM), an extension unit (EXT), a pre-baking unit (PAB), and post-exposure baking units (PEB) are stacked in order from the bottom. Also, in the fourth group G4, oven-type treatment units, such as a cooling unit (COL), an extension and cooling unit (EXTCOL), an extension unit (EXT), pre-baking units (PAB), and post-exposure baking units (PEB) are stacked in order from the bottom. Note that a post-baking unit for performing heat treatment after the development may be disposed.

As described above, the cooling unit (COL) and the extension and cooling unit (EXTCOL) with low treatment temperatures are disposed at lower tiers, and the baking unit (PAB) and the post-exposure baking unit (PEB) with high treatment temperatures are disposed at upper tiers. This vertical arrangement enables reduction of mutual thermal interference between the units. However, a random multi-tier arrangement is also possible.

The interface section 12 has the same dimension as that of the treatment station 11 in the depth direction but has a smaller size than that of the treatment station 11 in the width direction. In the interface section 12, a transportable pick-up cassette CR and a stationary buffer cassette BR are two-tiered at the front portion, an edge exposure apparatus 23 is disposed at the rear portion, and a wafer transfer body 24 is disposed at the central portion. The wafer transfer body 24 is configured to move in the X- and Z-directions to access both the cassettes CR and BR and the edge exposure apparatus 23. The wafer transfer body 24 is also configured to be rotatable in the θ-direction to be accessible to the extension unit (EXT) included in the multi-tiered units in the fourth group G4 on the treatment station 11 side and to a wafer delivery table (not illustrated) on the exposure apparatus side adjacent thereto.

Figure 4:
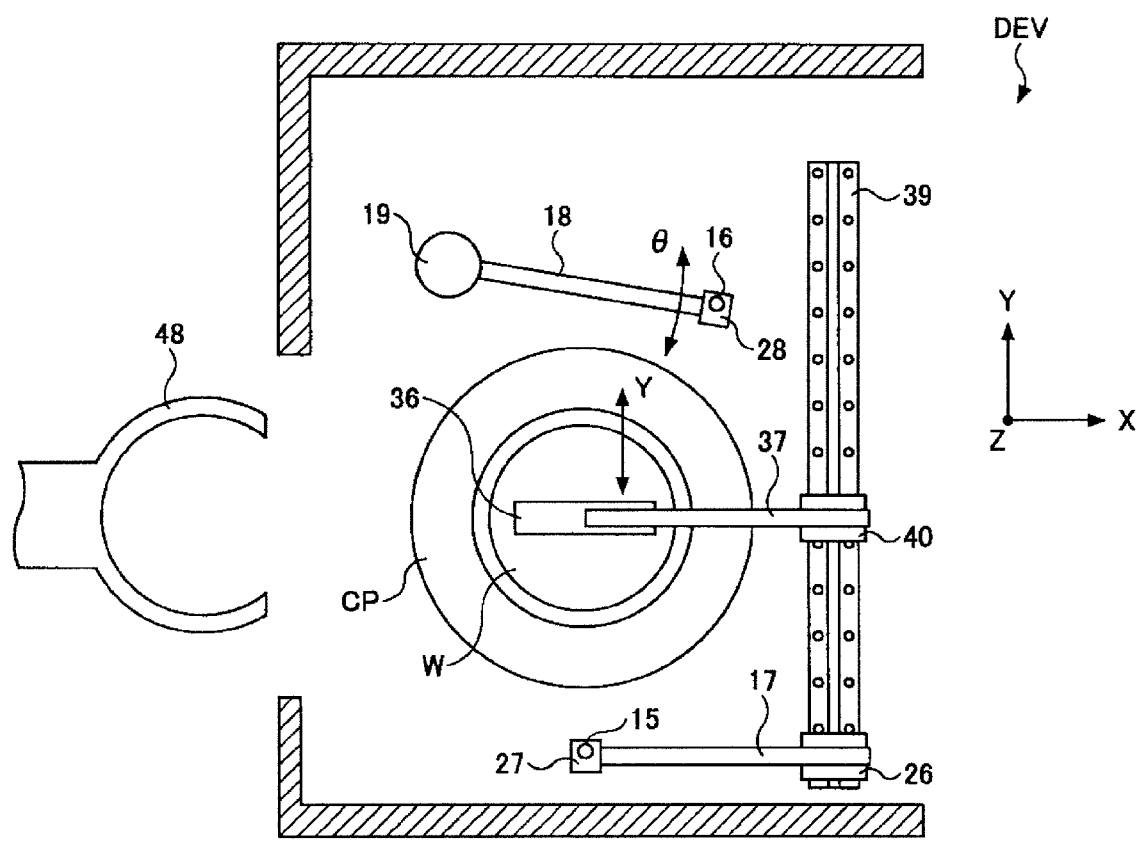
FIG. 4 A plan view illustrating a developing treatment unit according to the embodiment of the present invention.
Figure 5:
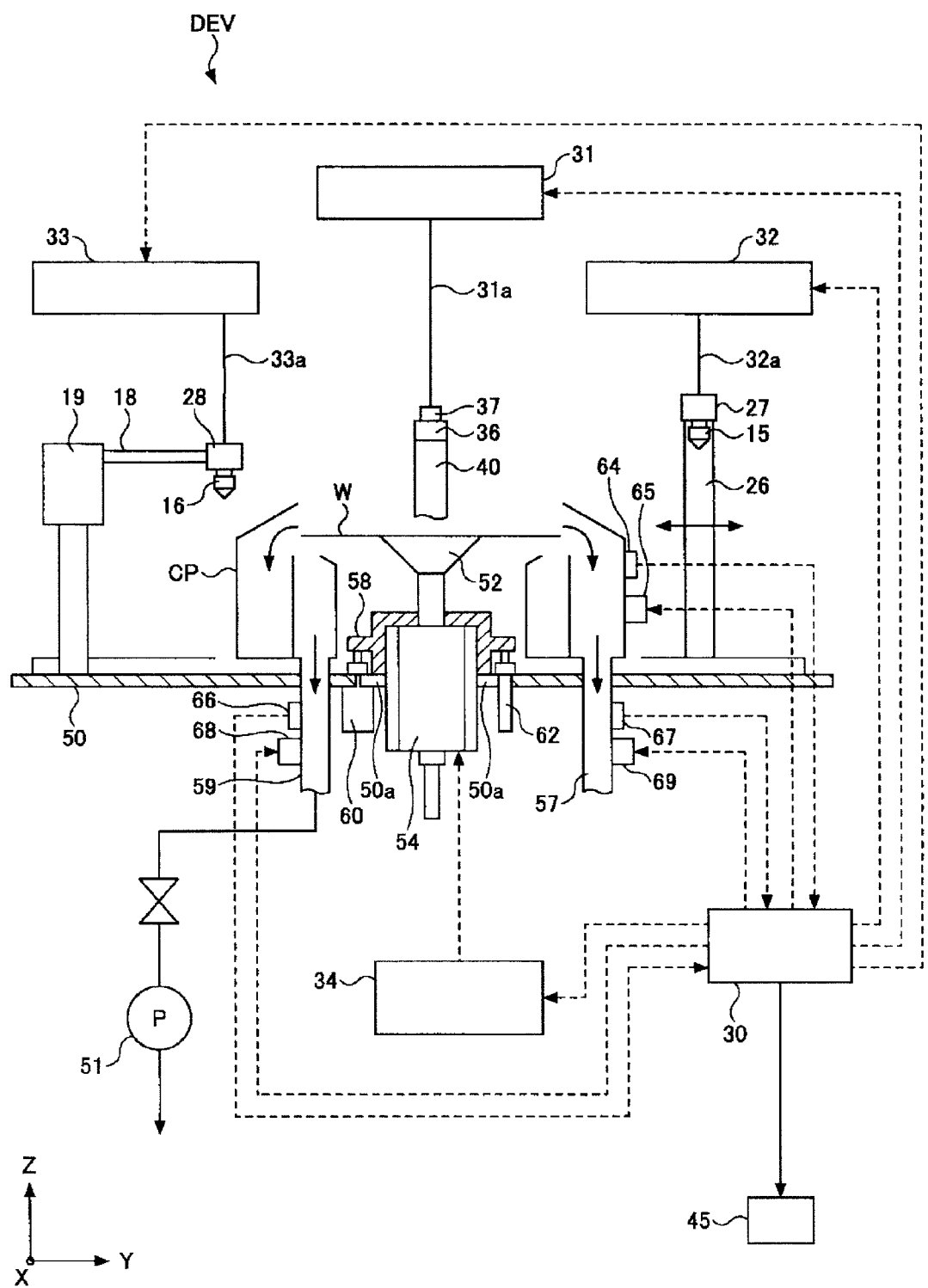
FIG. 5 A sectional view illustrating the developing treatment unit illustrated in FIG. 4.

FIG. 4 and FIG. 5 are a plan view and a sectional view illustrating the developing treatment unit (DEV) according to the embodiment of the present invention. At the center portion of the developing treatment unit (DEV), an annular cup CP is disposed to which the transfer arm 48 of the wafer transfer device 46 is provided to freely move back and forth. Inside the cup CP, a spin chuck 52 horizontally holding the wafer W is disposed. The spin chuck 52 is driven to rotate by a driving motor 54 with the spin chuck 52 fixedly holding the wafer W by vacuum suction. The driving motor 54 is disposed to be able to rise and lower at an opening 50a provided at a unit bottom plate 50, and coupled to a raising and lowering driving means 60 and a raising and lowering guide means 62 composed of air cylinders via a flange member 58 in a cap shape made of aluminum. Such a raising and lowering mechanism enables delivery of the wafer W to/from the main wafer transfer mechanism 22.

As illustrated in FIG. 5, a developing solution nozzle 36 for supplying a developing solution to the surface of the wafer W is attached to the tip end portion of a nozzle scan arm 37 above the wafer W housed in the cup CP. To the developing solution nozzle 36, a supply pipe 31a is connected so that the developing solution is supplied via the supply pipe 31a by a developing solution supply mechanism 31. The developing solution nozzle 36 has a long shape and is configured such that the developing solution is supplied through, for example, a plurality of holes or a supply port formed in a slit shape which is not illustrated. The nozzle scan arm 37 is attached to the upper end portion of a vertical support member 40 which is horizontally movable on a guide rail 39 provided in one direction (the Y-direction) on the unit bottom plate 50, and is configured to move in the Y-direction together with the vertical support member 40 by a not-illustrated Y-direction driving mechanism. Further, the nozzle scan arm 37 is configured to be movable also in the Z-direction along the vertical support member 40 and to be able to adjust the distance between the developing solution nozzle 36 and the wafer W held on the spin chuck 52.

Further, a rinse nozzle 15 held by a nozzle holding body 27 for supplying a rinse solution to the surface of the wafer W is provided, as with the developing solution nozzle 36, to be movable in the Y-direction along the guide rail 39 by a nozzle scan arm 17 and a vertical support member 26. To the rinse nozzle 15, a supply pipe 32a is connected so that the rinse solution is supplied from a rinse solution supply mechanism 32 via the supply pipe 32a. As the rinse solution, for example, pure water is used here. The nozzle scan arm 17 is also configured to be movable along the vertical support member 26 and to be able to adjust the distance between the rinse nozzle 15 and the wafer W held on the spin chuck 52.

Adjacent to the cup CP, a treatment solution nozzle 16 held by a nozzle holding body 28 for supplying a treatment solution made by diluting a hydrophobizing agent hydrophobizing the surface of the resist pattern on the wafer W with an organic solvent containing fluorine, is attached to the tip of a nozzle scan arm 18. The nozzle scan arm 18 is provided to be turnable by a motor 19 in the θ-direction about the motor 19. To the treatment solution nozzle 16, a supply pipe 33a is connected so that the treatment solution is supplied from a treatment solution supply mechanism 33 via the supply pipe 33a. The hydrophobizing agent hydrophobizing the resist pattern is not particularly limited and, for example, a chemical compound having a silyl group expressed by $(CH_3)_3Si$ in a molecule can be used here. One example can be TMSDMA (trimethylsilyldimethyl-amine). Further, as the organic solvent containing fluorine diluting the hydrophobizing agent, for example, a hydrofluoroether (HFE)-based solvent (a mixture or either of methyl perfluoroisobutyl ether and methyl perfluorobutyl ether) higher in volatility than pure water can be used. Further, xylene, hexamethyldisilazane or the like can be used. Note that the hydrofluoroether (HFE)-based solvent is a solvent which does not dissolve the resist and thus causes no problem even if it is supplied onto the resist.

At the bottom in the cup CP, a drain pipe 57 for draining the developing solution, the rinse solution, and the treatment solution supplied on the wafer is provided to drain the solutions to the outside of the not-illustrated system. Further, at the bottom of the cup CP, an exhaust pipe 59 for exhausting the atmosphere in the cup CP such as mist generated by the supply of the developing solution and the treatment solution and so on is provided so that the atmosphere is exhausted at all times by a vacuum pump 51 during normal operation.

Further, a temperature sensor 64 for measuring the temperature of the cup CP is attached to the cup CP, and a temperature regulation heater 65 for regulating the temperature in the cup CP is provided. The temperature regulation heater 65 regulates the temperature of the whole cup CP to a predetermined temperature, for example, around 23° C. at normal time.

Further, temperature sensors 66 and 67 for measuring the temperatures of the exhaust pipe 59 and the drain pipe 57 and temperature regulation heaters 68 and 69 for regulating the temperatures of the exhaust pipe 59 and the drain pipe 57 are similarly attached also to the exhaust pipe 59 and the drain pipe 57 in the cup CP respectively.

The developing solution supply mechanism 31, the rinse solution supply mechanism 32, and the treatment solution supply mechanism 33 are configured to supply the developing solution, the rinse solution, and the treatment solution to the developing solution nozzle 36, the rinse nozzle 15, and the treatment solution nozzle 16 respectively based on commands from a control unit 30 respectively. Further, the control unit 30 controls the timings to supply of the above-described treatment solutions and transmits a command to a motor controller 34 controlling the number of rotations of the driving motor 54 to perform collective processing.

The temperatures of the respective parts are measured by the above-described temperature sensors 64, 66, 67, and when the measured temperatures are out of predetermined normal ranges, the control unit 30 determines that the parts are abnormal, and a warning device 45 receives the determination and issues some warning. As the warning device, for example, a warning buzzer, a warning light, or a warning display on an operation display or the like is used.

Figure 6:
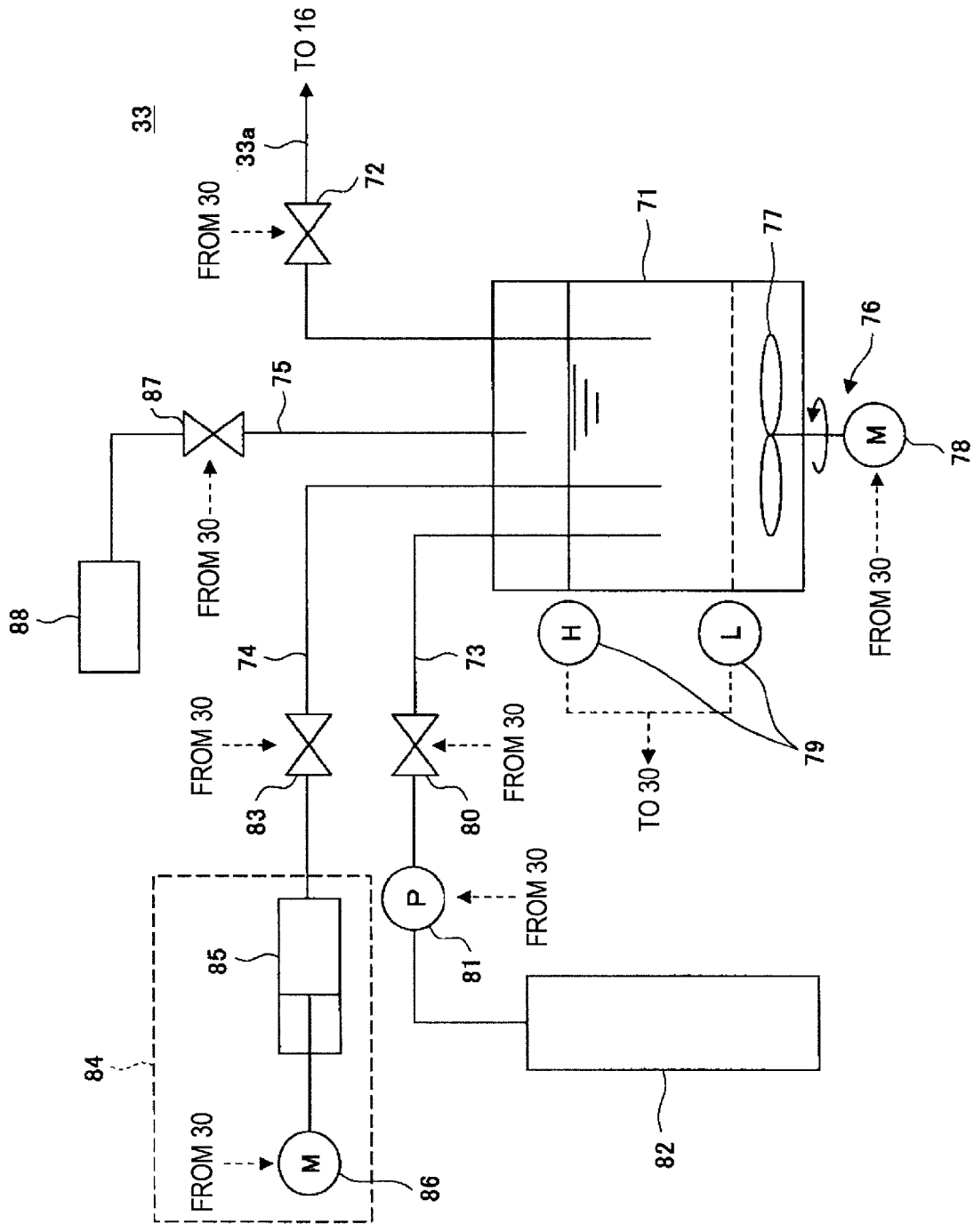
FIG. 6 A diagram illustrating a treatment solution supply mechanism according to the embodiment of the present invention.

FIG. 6 is a diagram illustrating the treatment solution supply mechanism according to the embodiment of the present invention. The treatment solution supply mechanism 33 has a treatment solution storage tank 71 storing the treatment solution made by diluting the hydrophobizing agent with HFE. The treatment solution storage tank 71 is connected to one end of the supply pipe 33a for supplying the treatment solution, and the other end of the supply pipe 33a is connected to the treatment solution nozzle 16 as described above via a valve 72 provided to be openable and closable by the control unit 30.

To the treatment solution storage tank 71, ends of an HFE supply pipe 73 for supplying HFE and a hydrophobizing agent supply pipe 74 for supplying the hydrophobizing agent being TMSDMA are connected to mix and adjust the treatment solution. A pressurizing gas supply pipe 75 of an $N_2$ gas or the like for pressurizing the inside of the treatment solution storage tank 71 to supply the treatment solution to the supply pipe 33a is also connected. Further, a stirring mechanism 76 for stirring and mixing the supplied hydrophobizing agent and HFE is provided inside the treatment solution storage tank 71. The stirring mechanism 76 has a stirring part 77 provided inside the treatment solution storage tank 71 and a motor 78 provided outside the treatment solution storage tank 71 for rotating and driving the stirring part 77 to be controllable by the control unit 30. Further, the treatment solution storage tank 71 is provided with a liquid level indicator 79 detecting the upper limit and the lower limit of the liquid level of the stored treatment solution and transmitting a detected signal to the control unit 30.

The HFE supply pipe 73 has the other end connected to an HFE supply source 82 supplying HFE via a valve 80 to be openable and closable by the control unit 30 and a pump 81 provided to be similarly controllable by the control unit 30.

The hydrophobizing agent supply pipe 74 has the other end connected to a hydrophobizing agent supply source 84 via a valve 83 provided to be openable and closable by the control unit 30. The hydrophobizing agent supply source 84 can supply a proper amount of the hydrophobizing agent which is small in amount as compared to HFE and has, for example, a syringe pump 85 supplying the hydrophobizing agent via a syringe and a motor 86 provided to be controllable by the control unit 30 for driving the syringe pump 85.

The pressurizing gas supply pipe 75 has the other end connected to a pressurizing gas supply source 88 supplying, for example, an N₂ gas or the like via a valve 87 provided to be openable and closable by the control unit 30.

In the treatment solution supply mechanism 33 configured as described above, the valve 80 is opened based on the control from the control unit 30 to supply a predetermined flow rate of HFE to the treatment solution storage tank 71 through the HFE supply pipe 73 via the pump 81 from the HFE supply source 82. Further, the valve 83 is opened based on the control from the control unit 30 to supply the hydrophobizing agent to the treatment solution storage tank 71 through the hydrophobizing agent supply pipe 74 from the syringe pump 85 driven by the motor 86 into a predetermined mixture ratio with HFE. The supplied HFE and hydrophobizing agent are uniformly stirred by the stirring mechanism 76 and stored in the treatment solution storage tank 71. The supply and mixture of HFE and hydrophobizing agent to/in the treatment solution storage tank 71 are continuously or intermittently performed, and its solution amount is maintained such that the liquid level detected by the liquid level indicator 79 exists between the upper limit and the lower limit.

When supplying the treatment solution from the treatment solution storage tank 71 storing the treatment solution to the treatment solution nozzle 16, the valve 87 is opened to supply the pressurizing gas from the pressurizing gas supply source 88 to the treatment solution storage tank 71 through the pressurizing gas supply pipe 75. Then, the valve 72 is opened to supply the treatment solution to the treatment solution nozzle 16 through the supply pipe 33*a*. On the other hand, when stopping the supply of the treatment solution to the treatment solution nozzle 16, the valve 72 of the supply pipe 33*a* is closed and the valve 87 is closed to stop also the supply of the pressurizing gas from the pressurizing gas supply source 88.

A series of treatment processes of the above-described coating and developing treatment system 1 will be described.

First, in the cassette station 10, the wafer transfer body 21 accesses a cassette CR housing wafers before treatment on the cassette mounting table 20 and takes one wafer W out of the cassette CR. The taken-out wafer W is transferred to the alignment unit (ALIM) and aligned. The wafer W is then transferred by the main wafer transfer mechanism 22 to the adhesion unit (AD) and subjected to a hydrophobic treatment.

The wafer W is subsequently transferred to the cooling unit (COL) and subjected to a cooling treatment. The wafer W is then transferred to the resist coating treatment unit (COT) and subjected to a resist coating treatment, transferred to the pre-baking unit (PAB) and subjected to a predetermined heat treatment, and transferred to the cooling unit (COL) and subjected to a predetermined cooling treatment. The wafer W is then transferred by the wafer transfer body 24 to the not-illustrated exposure apparatus via the interface section 12 and subjected to an exposure treatment. The wafer W for which the exposure treatment has been completed is transferred to the post-exposure baking unit (PEB) and subjected to a predetermined-heat treatment, and then transferred to the developing treatment unit (DEV) and subjected to a developing treatment. After the developing treatment, a predetermined heat treatment (post-baking) is performed sometimes. Thereafter, the wafer W is transferred to the cooling unit (COL) and subjected to a predetermined cooling treatment, and returned to the cassette CR through the extension unit (EXT).

Figure 7:
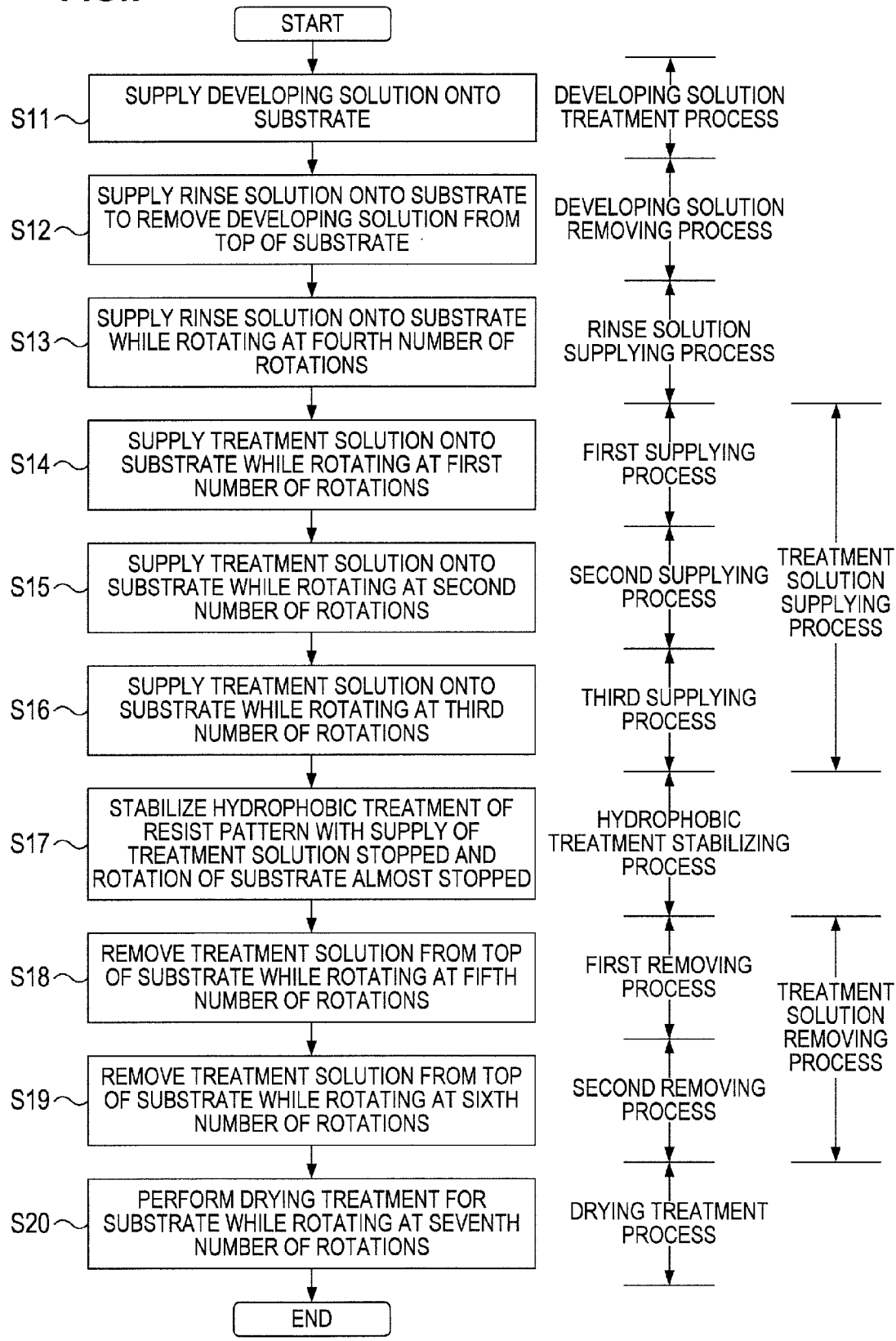
FIG. 7 A flowchart for explaining the procedure of processes of a developing treatment method using the developing treatment unit.
Figure 8:
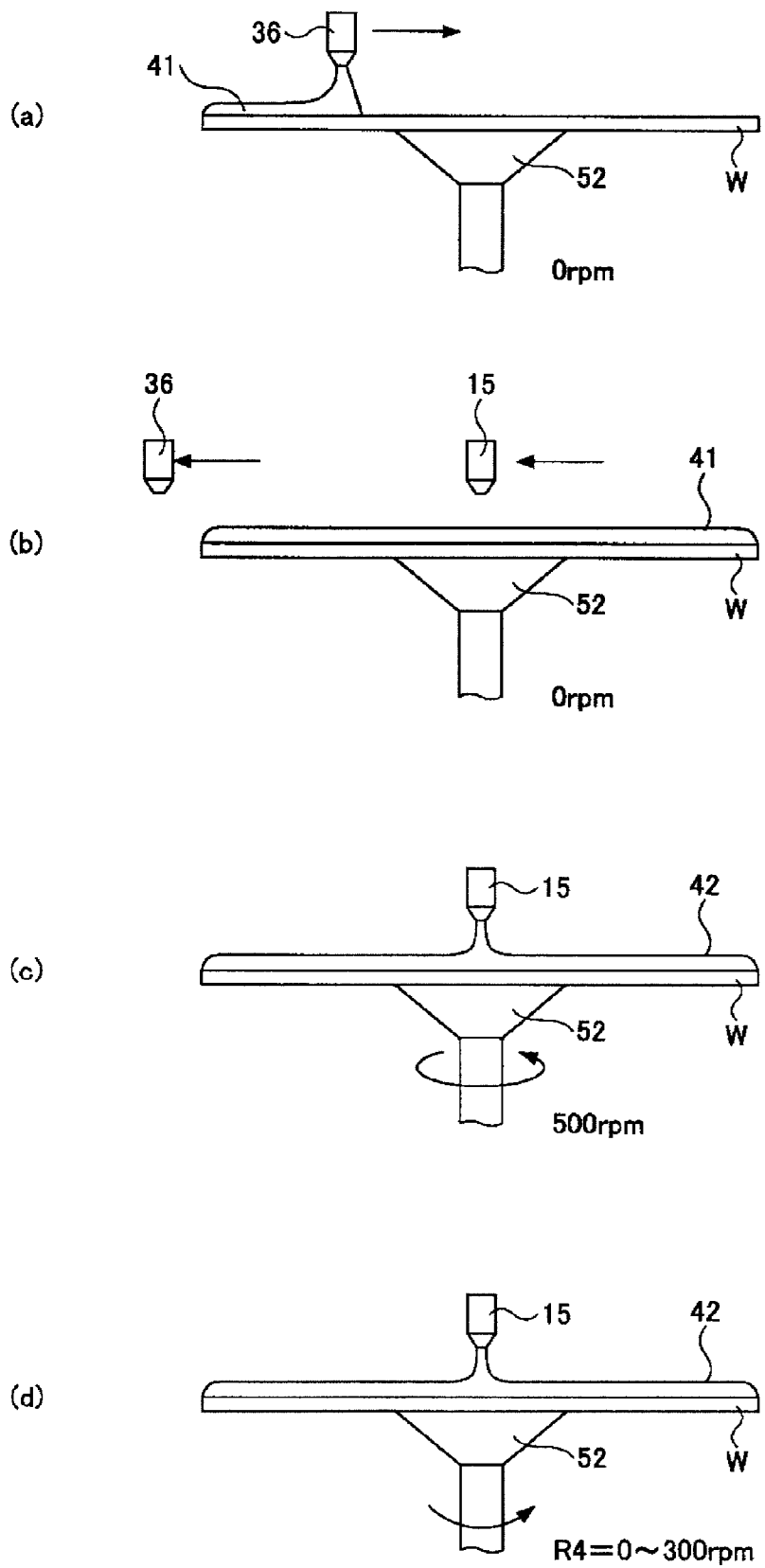
FIG. 8 A side view (first) when performing the processes of the developing treatment method using the developing treatment unit.
Figure 9:
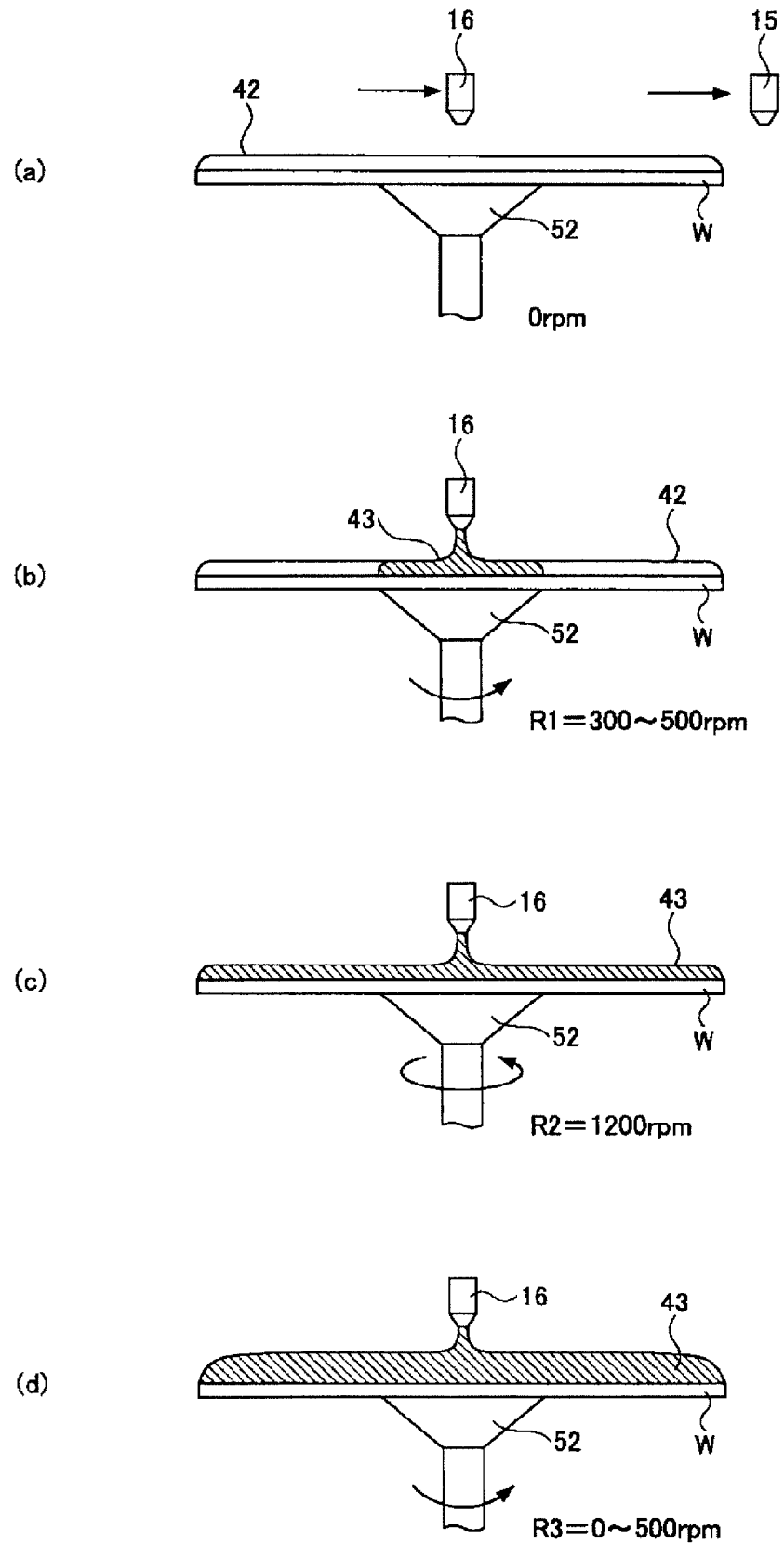
FIG. 9 A side view (second) when performing the processes of the developing treatment method using the developing treatment unit.
Figure 10:
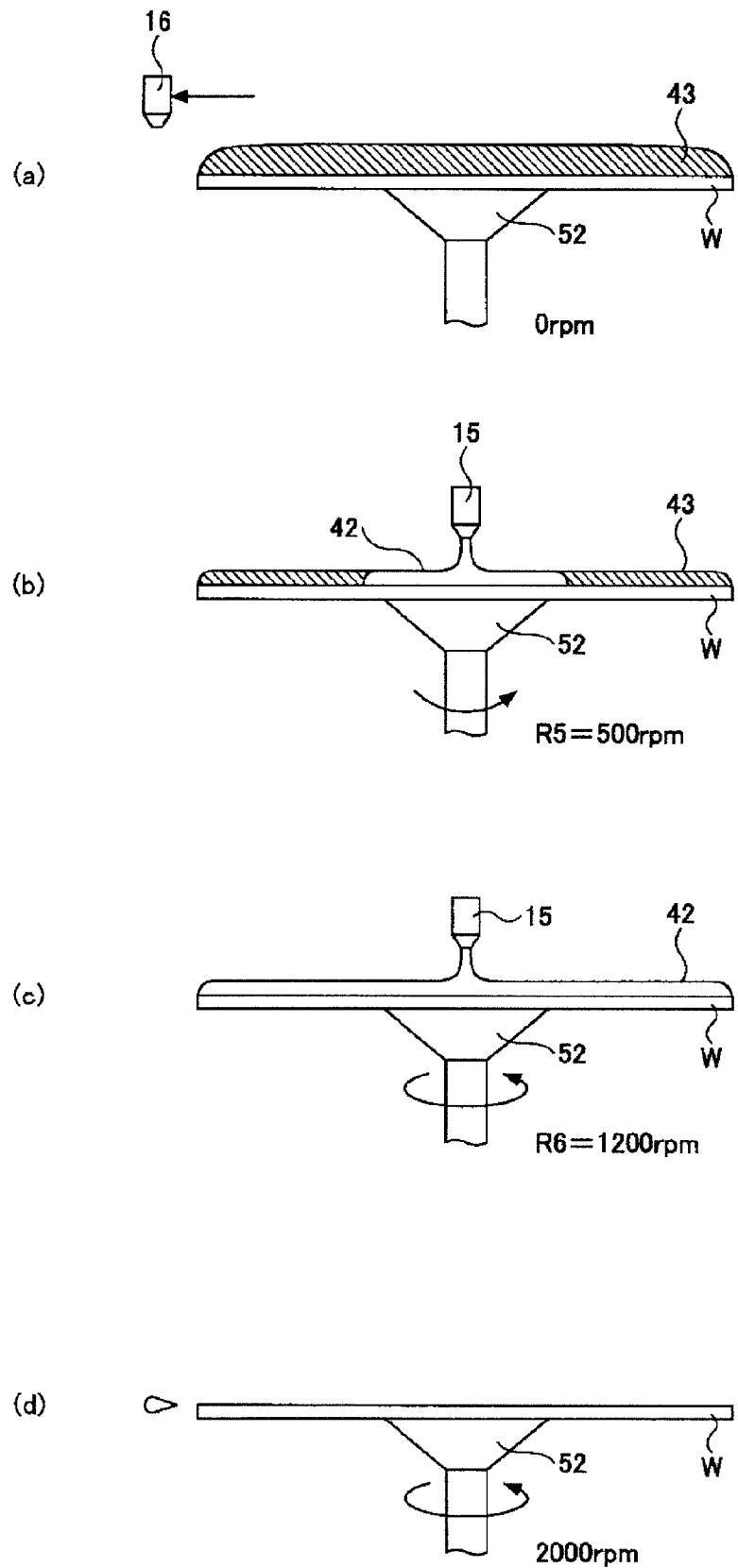
FIG. 10 A side view (third) when performing the processes of the developing treatment method using the developing treatment unit.
Figure 11:
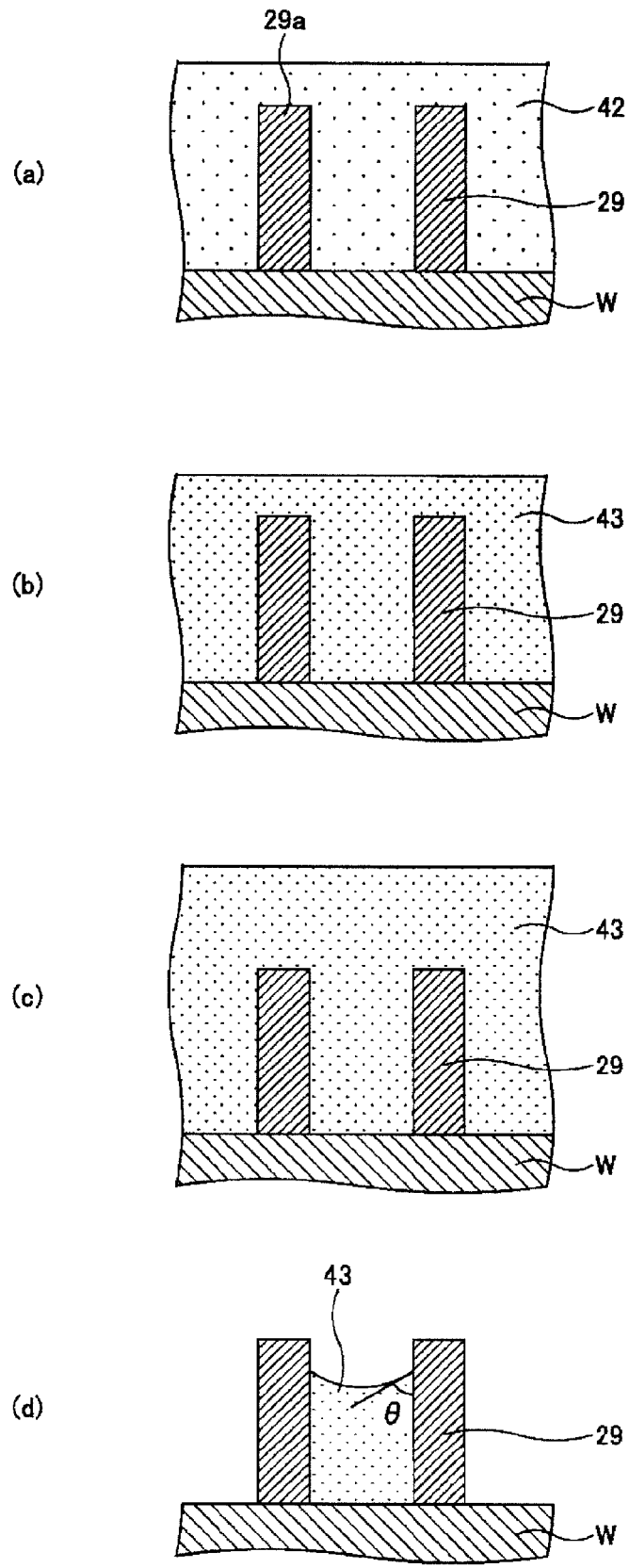
FIG. 11 An enlarged sectional view illustrating the resist pattern during the developing treatment.

Next, the developing treatment method using the developing treatment unit will be described referring to FIG. 7 to FIG. 11. FIG. 7 is a flowchart for explaining the procedure of processes. FIG. 8 to FIG. 10 are side views when performing the processes, and FIG. 11 is an enlarged sectional view illustrating the resist pattern during the developing treatment.

As illustrated in FIG. 7, the developing treatment method according to this embodiment has a developing solution supplying process (Step S11), a developing solution removing process (Step S12), a rinse solution supplying process (Step S13), a treatment solution supplying process (Step S14 to Step S16), a hydrophobic treatment stabilizing process (Step S17), a treatment solution removing process (Step S18 and Step S19), and a drying treatment process (Step S20). The treatment solution supplying process has a first supplying process (Step S14), a second supplying process (Step S15), and a third supplying process (Step S16). The treatment solution removing process has a first removing process (Step S18) and a second removing process (Step S19).

Further, an example of the treatment recipe performed by the developing treatment method illustrated in FIG. 7 is presented in Table 1.

TABLE 1

| Step number | Process name | Time (sec) | Number of rotations (rpm) | Supplied chemical |
|---|---|---|---|---|
| S13 | rinse solution supplying process | 2 | 0-300 (R4) | rinse solution |
| S14 | first supplying process | 2 | 300-500 (R1) | treatment solution |
| S15 | second supplying process | 3 | 1200 (R2) | treatment solution |
| S16 | third supplying process | 3 | 0-500 (R3) | treatment solution |
| S17 | hydrophobic treatment stabilizing process | 10 | 0 | — |
| S18 | first removing process | 5 | 500 (R5) | rinse solution |
| S19 | second removing process | 10 | 1200 (R6) | rinse solution |
| S20 | drying process | 15 | 2000 | — |

The columns in Table 1 indicate the step number of each step, process name, time, number of rotations (rpm), and the kind of the chemical supplied in the step in order from the left.

First, the developing solution supplying process (Step S11) is performed. In the developing solution supplying process (Step S11), the developing solution is supplied to the substrate to develop the resist pattern.

The spin chuck 52 is first raised and receives the wafer W from the main wafer transfer mechanism 22, and the spin chuck 52 is then lowered to house the wafer W in the cup CP. Then, as illustrated in FIG. 8(a), the developing solution nozzle 36 is moved above the wafer W while discharging a developing solution 41, and the wafer W is kept stand after finish of the discharge, for example, for 60 seconds to promote the developing treatment. In order to increase the throughput here, the developing solution 41 may be discharged while the wafer W is rotated. In this case, the developing treatment is promoted by extending the developing solution 41 by rotating the wafer W at a predetermined number of rotations and keeping the wafer W stand, for example, for 60 seconds.

Next, the developing solution removing process (Step S12) is performed. In the developing solution removing process (Step S12), the rinse solution is supplied onto the substrate on which the resist pattern has been developed to remove the developing solution from the top of the substrate.

As illustrated in FIG. 8(b), the developing solution nozzle 36 is moved to the outside of the cup, and the rinse nozzle 15 is moved to above the center of the wafer W. Then, as illustrated in FIG. 8(c), a rinse solution 42 is discharged while the wafer W is rotated, to wash away the developing solution 41. In this event, since the discharge is performed while the wafer W is rotated, the rinse solution 42 using pure water rinses the surface of the wafer W while the developing solution 41 is being shaken off.

To prevent an upper surface 29a of the developed resist pattern 29 from existing outside the rinse solution 42 as illustrated in FIG. 11(a), the number of rotations of the wafer W is set to a low speed of 300 rpm to 800 rpm, more preferably, 500 rpm. This is because if the upper surface 29a of the resist pattern 29 exists outside the rinse solution 42, the surface tension of the rinse solution 42 may cause pattern collapse. The rotation of the wafer W is set to a relatively low speed rotation of 300 rpm to 800 rpm as described above to thereby decrease as much as possible the speed of the rinse solution 42 flowing on the wafer W, thereby preventing the resist pattern 29 from collapsing when the developing solution 41 is washed away. Note that the resist pattern may be called a "pattern" hereinafter.

Next, the rinse solution supplying process (Step S13) is performed. In the rinse solution supplying process (Step S13), the rinse solution is supplied while the substrate is rotated at a fourth number of rotations R4 that is lower than the number of rotations (a first number of rotations) in the subsequent first supplying process.

In the developing solution removing process (Step S12), a solution film (pure water puddle) of the rinse solution (pure water) is formed on the surface of the wafer W so that the surface of the wafer W rinsed with the rinse solution 42 does not dry, namely, does not experience liquid shortage until the treatment solution is supplied at the next treatment solution supplying process (Step S14 to Step S16). As illustrated in FIG. 8(d), the number of rotations R4 of the wafer W (corresponding to the fourth number of rotations in the present invention) is set to 0 rpm to 300 rpm, more preferably, 100 rpm.

Next, the treatment solution supplying process (Step S14 to Step S16) is performed. In the treatment solution supplying process (Step S14 to Step S16), the treatment solution made by diluting the hydrophobizing agent hydrophobizing the resist pattern with hydrofluoroether (FIFE) is supplied onto the substrate on which the resist pattern has been developed and then the rinse solution has been supplied. Further, the treatment solution supplying process (Step S14 to Step S16) has the first supplying process (Step S14), the second supplying process (Step S15), and the third supplying process (Step S16) as described above.

First, the first supplying process (Step S14) is performed. In the first supplying process (Step S14), the treatment solution is supplied onto the substrate while the substrate is rotated at the first number of rotations R1.

As illustrated in FIG. 9(a), the rinse nozzle 15 is moved to the outside of the cup, and the treatment solution nozzle 16 is moved to above the center of the wafer W. Then, as illustrated in FIG. 9(b), the wafer W is rotated at 300 rpm to 500 rpm, more preferably, 400 rpm, and a treatment solution 43 is discharged onto the center of the wafer W. More specifically, the first number of rotations R1 is 300 rpm to 500 rpm. When the first number of rotations R1 is lower than 300 rpm, the treatment solution 43 does not uniformly mix into the rinse solution 42 on the wafer W but the treatment solution 43 becomes granular and disperses into the rinse solution 42, so that if the shake-off drying by the rotation of the wafer W is performed in this state, the pattern collapse occurs. On the other hand, when the number of rotations R1 is higher than 500 rpm, the treatment solution 43 uniformly extends, but the rinse solution 42 is likely to flow out from the top of the wafer W before the treatment solution 43 extends to cause the pattern collapse.

Next, the second supplying process (Step S15) is performed. In the second supplying process (Step S15), the treatment solution is supplied onto the substrate while the substrate is rotated at a second number of rotations R2 higher than the first number of rotations R1.

As illustrated in FIG. 9(c), the wafer W is rotated at 1000 rpm to 1500 rpm, more preferably, 1200 rpm to replace the rinse solution 42 remaining on the wafer W with the treatment solution 43 as illustrated in FIG. 11(b). The replacement with the treatment solution 43 by rotating the wafer W at a high speed of 1000 rpm to 1500 rpm as described above makes it possible to cause the treatment solution 43 to extend over the entire surface of the wafer W while preventing the pattern collapse when the rinse solution 42 flows out from the top of the wafer W.

Next, the third supplying process (Step S16) is performed. In the third supplying process (Step S16), the treatment solution is supplied onto the substrate while the substrate is rotated at a third number of rotations R3 lower than the second number of rotations R2.

As illustrated in FIG. 9(d), the wafer W is rotated at 0 rpm to 500 rpm, more preferably, 300 rpm to adjust the solution amount of the treatment solution 43 on the resist pattern 29 as illustrated in FIG. 11(c). The wafer W is rotated at a low speed of 0 rpm to 500 rpm, whereby the solution amount of the treatment solution 43 on the wafer W can be adjusted. In short, the third number of rotations R3 is 0 rpm to 500 rpm. When the third number of rotations R3 is higher than 500 rpm, the treatment solution 43 is shaken off the top of the wafer W, resulting in a decreased solution amount of the treatment solution 43.

Next, the hydrophobic treatment stabilizing process (Step S17) is performed. In the hydrophobic treatment stabilizing process (Step S17), the hydrophobic treatment of the resist pattern is stabilized with the supply of the treatment solution stopped and the rotation of the substrate almost stopped.

As illustrated in FIG. 10(*a*), the discharge of the treatment solution 43 is stopped, the treatment solution nozzle 16 is moved to the outside of the cup, and the hydrophobic treatment of the surface of the resist pattern 29 is stabilized on the entire surface of the wafer W while the number of rotations of the wafer W is brought to 0 to 50 rpm or, more preferably, the rotation is stopped.

Next, the treatment solution removing process (Step S18 and Step S19) is performed. In treatment solution removing process (Step S18 and Step S19), the treatment solution is removed from the top of the substrate on which the treatment solution has been supplied. Further, the treatment solution removing process (Step S18 and Step S19) has the first removing process (Step S18) and the second removing process (Step S19) as described above.

First, the first removing process (Step S18) is performed. In the first removing process (Step S18), the treatment solution is removed from the top of the substrate while the substrate is rotated at the fifth number of rotations R5.

As illustrated in FIG. 10(*b*), the wafer W is rotated at 300 rpm to 700 rpm, more specifically, 500 rpm. The rotation of the wafer W at a low speed of 300 rpm to 700 rpm as described above makes it possible to slightly remove the treatment solution 43 on the surface of the wafer W. The treatment solution 43 may be removed here while the rinse solution 42 composed of pure water is discharged from near the center of the wafer as necessary.

Next, the second removing process (Step S19) is performed. In second removing process (Step S19), the treatment solution is removed from the top of the substrate while the substrate is rotated at a sixth number of rotations R6 higher than the fifth number of rotations R5.

As illustrated in FIG. 10(*c*), the wafer W is rotated at 1000 rpm to 1500 rpm, more preferably, 1200 rpm. The rotation of the wafer W at a high speed of 1000 rpm to 1500 rpm as described above makes it possible to efficiently remove the treatment solution 43 on the surface of the wafer W. The treatment solution 43 may be removed while the rinse solution 42 composed of pure water is discharged from near the center of the wafer as necessary as in the first removing process.

A contact angle θ of the treatment solution 43 with respect to the resist pattern 29 illustrated in FIG. 11(*d*) is 85° to 95°, so that if the treatment solution 43 flows out of the space between patterns, no pattern collapse occurs because of its low surface tension. A more preferable contact angle θ is 90° to 95° as will be described later using FIG. 14. Such a high contact angle can be achieved because the treatment solution 43 is made by diluting TMSDMA being the hydrophobizing agent with HFE having a surface tension lower than the surface tension of the rinse solution. Further, after the hydrophobic treatment is once performed, such a high contact angle can be achieved with respect to the rinse solution 42 made of pure water. TMSDMA has a hydrophobic group such as a silyl group having hydrophobic property as will be described later and replaces the surface of the resist pattern 29 with the hydrophobic group such as the silyl group. Further, HFE has fluorine and therefore coats the surface of the resist pattern 29 with fluorine as will be described later. These can realize the above-described contact angle.

Further, since HFE is greater in specific gravity than pure water, the treatment solution 43 is located at a portion lower than the rinse solution 42 during supply of the treatment solution 43 in FIG. 9(*c*), so that the rinse solution 42 becomes easy to flow out between the resist patterns 29. Accordingly, the pattern collapse is more effectively prevented.

Then, the drying treatment process (Step S20) is finally performed. In drying treatment process (Step S20), the drying treatment is performed by rotating the substrate at a predetermined number of rotations.

As illustrated in FIG. 10(*d*), the wafer W is rotated at a high speed of 1500 rpm to 2500 rpm, more preferably, 2000 rpm to sufficiently dry the surface of the wafer W.

Next, the operation and effect that the treatment solution prevents the pattern collapse of the resist pattern in this embodiment will be described.

Figure 12:
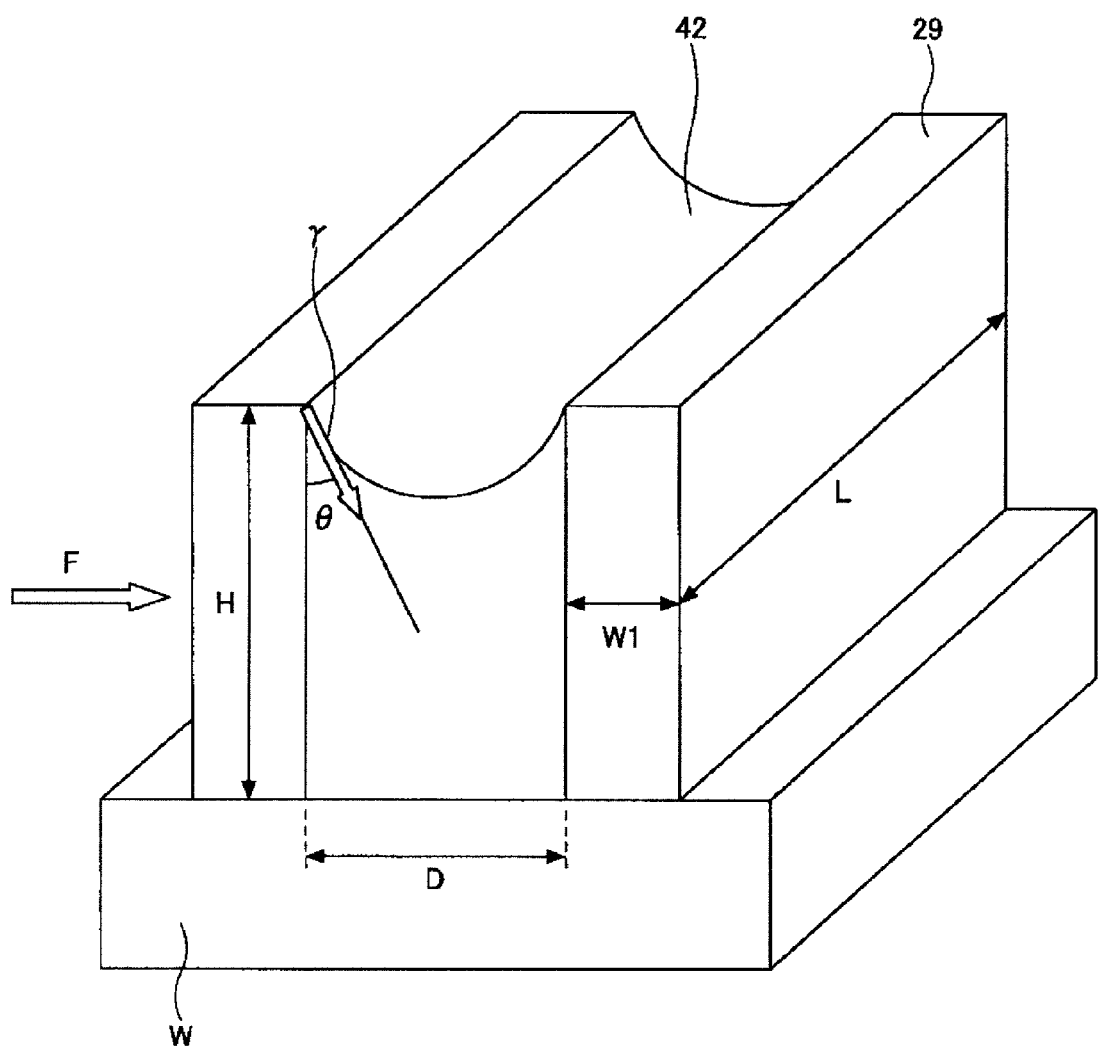
FIG. 12 A view for explaining the relation between the contact angle of a rinse solution and the force to collapse the pattern when the rinse solution exists between patterns.

FIG. 12 is a view for explaining the relation between the contact angle of the rinse solution and the force to collapse the pattern when the rinse solution exists between patterns. After rinsing with the rinse solution 42 between two resist patterns 29, such a state is made that one side of the resist pattern 29 is in contact with the rinse solution 42 and the other side dries and is in contact with air as illustrated in FIG. 12 at some stage during dry of the rinse solution 42. When this state is formed, the resist pattern 29 is pushed by the rinse solution 42 from the one side and is pushed by the air from the other side, so that if there is a pressure difference between them, a force will act to collapse the resist pattern 29. The force to collapse the pattern is expressed by the following Expression (1).

[Expression 1]

$$F = \frac{2\gamma\cos\theta}{D}HL \quad (1)$$

In the Expression (1), γ is the surface tension of the rinse solution, θ is the contact angle of the rinse solution at the pattern, D is the interval between patterns, H is the height of the pattern, and L is the length of the pattern. A force F collapsing the pattern generates a moment bending the pattern. Where the width of the pattern is W1, a maximum stress $\sigma_{MAX}$ on the pattern is expressed by the following Expression (2).

[Expression 2]

$$\sigma_{MAX} = \frac{6\gamma\cos\theta}{D}\left(\frac{H}{W1}\right)^2 \quad (2)$$

Accordingly, the pattern will collapse when $\sigma_{MAX}$ exceeds a collapsing stress $\sigma_{CRT}$ ($\sigma_{MAX} > \sigma_{CRT}$). Methods of preventing the pattern collapse conceivable from this expression include those of (1) increasing the interval D between patterns, (2) decreasing the height H or increasing the width W1 to reduce the aspect ratio (H/W1) of the pattern, (3) decreasing the surface tension γ of the rinse solution, (4) increasing the contact angle θ of the rinse solution at the pattern to decrease cos θ and so on.

The developing treatment method according to this embodiment is the one (4) increasing the contact angle θ, among the above-described ones, to reduce the maximum stress $\sigma_{MAX}$ on the pattern to prevent the pattern collapse.

Figure 13:
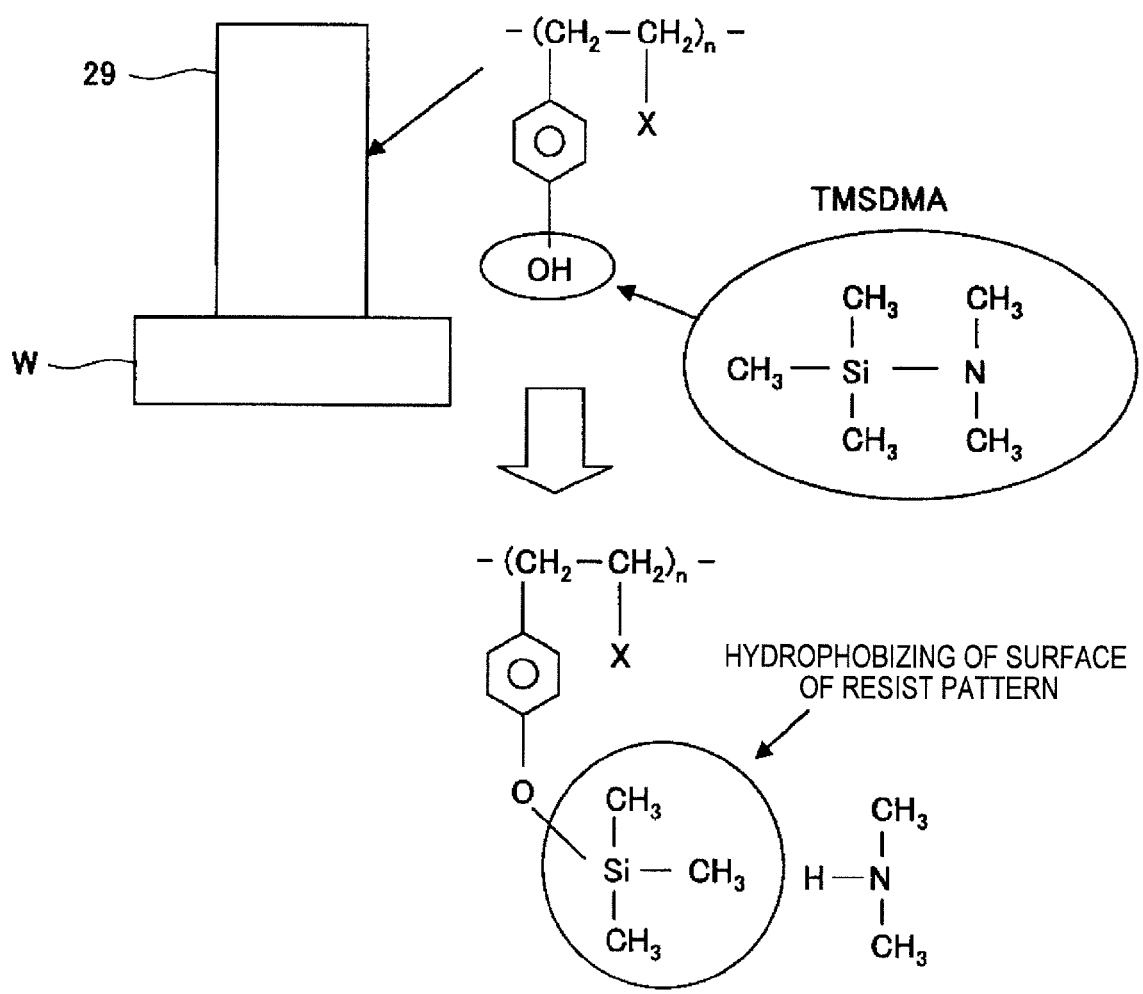
FIG. 13 A view for explaining a reaction mechanism in a hydrophobic treatment in which a treatment solution made by diluting TMSDMA with HFE hydrophobizes the surface of the resist pattern.

FIG. 13 is a view for explaining a reaction mechanism in the hydrophobic treatment in which the treatment solution made by diluting TMSDMA with HFE hydrophobizes the surface of the resist pattern. TMSDMA (trimethylsilyldimethyl-amine) contained in the treatment solution has a silyl group expressed by $(CH_3)_3Si$ in the molecule. On the other hand, the resist has an OH group in the polymer structure. The silyl group in TMSDMA causes a replacement reaction with H of the OH group in the resist on the surface of the resist pattern. The OH group is a hydrophilic group, whereas a group in which H of the OH group is replaced with the silyl group is a hydrophobic group. Accordingly, the hydrophobic group formed on the resist pattern surface hydrophobizes the surface of the resist pattern.

Next, the evaluation result about the effect of preventing the pattern collapse by the developing treatment method according to this embodiment will be described referring to FIG. 14 and Table 2 to Table 4.

Example 1

As Example 1, the processes from Step S11 to Step S20 illustrated in FIG. 7 were carried out. The processes at Step S13 to Step S20 were carried out under the conditions following the example of the recipe indicated in Table 1. However, the treatment solution made by diluting TMSDMA at a mixture ratio of HFE:TMSDMA=100:1 was used as the treatment solution supplied at Step S14 to Step S16 in Table 1.

Comparative Example 1

As Comparative Example 1, the processes at Step S11 to Step S20 illustrated in FIG. 7 were carried out as with Example 1 except that the kind of the treatment solution was changed. In Comparative Example 1, the treatment solution composed of HFE containing no TMSDMA was used as the treatment solution supplied at Step S14 to Step S16.

Comparative Example 2

As Comparative Example 2, the developing treatment method of rinsing only with the rinse solution (pure water) without performing the treatment solution supplying process and the hydrophobic treatment stabilizing process was carried out. In other words, Step S13 to Step S17 in the treatment recipe indicated in Table 1 were omitted, and the processes at Step S11, Step S12, Step S18 to Step S20 illustrated in FIG. 7 were carried out.

For each of the resist pattern after Example 1, Comparative Example 1, Comparative Example 2 was performed, a resist coating film that is the same as the resist pattern was subjected to the hydrophobic treatment, and its contact angle of the surface was measured. As the measurement method, a method of dripping pure water (0.1 ml) onto the surface and imaging it by a dedicated camera from the side to measure its contact angle was used. The results are presented in the graph in FIG. 14.

Figure 14:
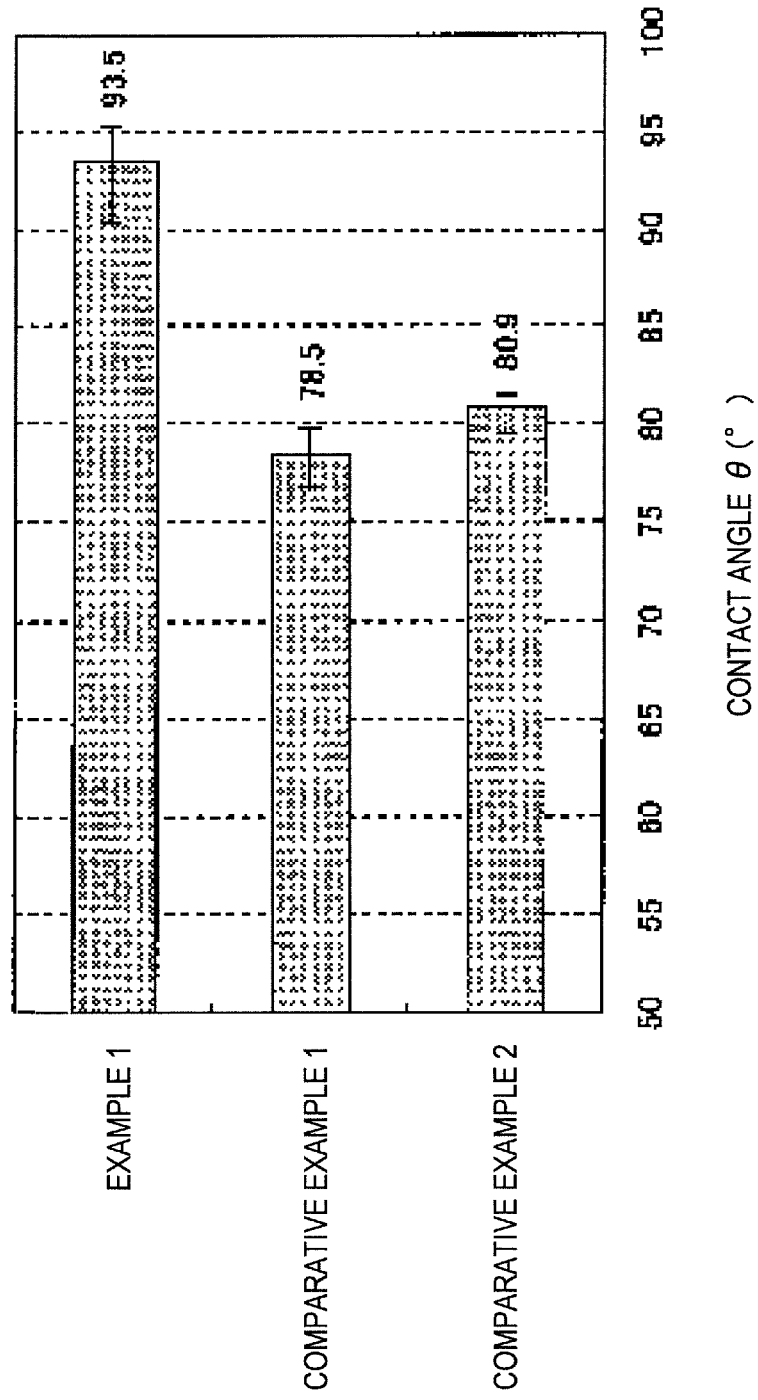
FIG. 14 A graph presenting results of measuring the contact angles about the resist patterns after performing Example 1, Comparative Example 1, Comparative Example 2 respectively.

As presented in FIG. 14, the contact angles θ were 93.5°, 78.5°, 80.9° respectively in Example 1, Comparative Example 1, Comparative Example 2. In short, a larger contact angle θ was obtained in Example 1 than in Comparative Example 1, Comparative Example 2. Accordingly, it became evident that the maximum stress $\sigma_{MAX}$ on the pattern could be made smaller in Example 1 than in Comparative Example 1, Comparative Example 2 as described above.

Example 1 is increased in contact angle more than not only Comparative Example 2 not using the treatment solution but also Comparative Example 1 using the treatment solution composed of HFE. This means that the contact angle less increases even if the resist surface is subjected to a fluorine treatment with the treatment solution composed of only HFE without containing the hydrophobizing agent. Further, the contact angle can be made 90° or more with the treatment solution having a mixture ratio of HFE:TMSDMA=100:1.

Example 2

As Example 2, the processes at Step S11 to Step S20 illustrated in FIG. 7 were carried out as with Example 1 except that the focus position was shifted from the best focus position at exposure and the dose amount at exposure was changed. As the pattern, a resist pattern having a line width of 120 nm and a space width of 120 nm (a pitch of 240 nm) and a height of 380 nm was formed. The CD (Critical Dimension) values being the line widths of the patterns each obtained corresponding to the condition of each shift amount of the focus position and each dose amount were measured using a Scanning Electron Microscope (SEM). Those values are presented in Table 2.

TABLE 2

| Dose amount at exposure (mJ) | Shift amount of focus position from best focus position (μm) | | | | |
|---|---|---|---|---|---|
| | −0.1 | 0 | +0.1 | +0.2 | +0.3 |
| 30 | 107.9 | 101.6 | 104.5 | 102.9 | 102.7 |
| 31 | 93.7 | 93.5 | 96.8 | 95.3 | 91.8 |
| 32 | 85.6 | 88.8 | 88.0 | 84.3 | 82.3 |
| 33 | 76.0 | 76.3 | 77.7 | 77.4 | — |
| 34 | 69.9 | 73.0 | — | — | — |

CD value (nm)

In Table 2, the colored box represents that the pattern collapse occurred under that condition. In Example 2, the pattern collapse did not occur under the carried out all of conditions of the shift amount of the focus position and the dose amount.

Comparative Example 3

As Comparative Example 3, the processes were carried out as with Comparative Example 1 except that the focus position was shifted from the best focus position at exposure and the dose amount at exposure was changed. As the pattern, a resist pattern having a line width of 120 nm and a space width of 120 nm (a pitch of 240 nm) and a height of 380 nm was formed as with Example 2. As in Comparative Example 1, the treatment solution composed of HFE containing no TMSDMA was used as the treatment solution supplied at Step S14 to Step S16. The CD values of the patterns each obtained corresponding to the condition of each shift amount of the focus position and each dose amount are presented in Table 3.

TABLE 3

| Dose amount at exposure (mJ) | Shift amount of focus position from best focus position (μm) | | | | |
|---|---|---|---|---|---|
| | −0.1 | 0 | +0.1 | +0.2 | +0.3 |
| 30 | 100.9 | 101.8 | 103.7 | 105.5 | 104.3 |
| 31 | 93.5 | 93.7 | 97.3 | 95.8 | 93.2 |
| 32 | 83.5 | 84.6 | 85.6 | 83.7 | 83.7 |
| 33 | X | 76.3 | 74.1 | 70.5 | - |
| 34 | X | 65.5 | - | - | - |

CD value (nm)
(colored box: condition causing pattern collapse,
X: CD value unmeasurable)

Also in Table 3, the colored box represents that the pattern collapse occurred under that condition. In Comparative Example 3, the pattern collapse occurred under part of the conditions of the dose amount of 32 mJ or more. This is because the CD value decreases with an increase in dose amount, and the pattern collapse becomes more likely to occur. Further, under part of the conditions of the dose amount of 33 mJ or more, the pattern collapse was prominent and the CD value could not be measured depending on the condition (indicated with "X").

Comparative Example 4

As Comparative Example 4, the processes were carried out as with Comparative Example 2 except that the focus position was shifted from the best focus position at exposure and the dose amount at exposure was changed. Further, as the pattern, a resist pattern having a line width of 120 nm and a space width of 120 nm (a pitch of 240 nm) and a height of 380 nm was formed as with Example 2. As in Comparative Example 2, the developing treatment method of rinsing only with the rinse solution (pure water) without performing the treatment solution supplying process and the hydrophobic treatment stabilizing process was carried out. The CD values of the patterns each obtained corresponding to the condition of each shift amount of the focus position and each dose amount are presented in Table 4.

TABLE 4

| Dose amount at exposure (mJ) | Shift amount of focus position from best focus position (μm) | | | | |
|---|---|---|---|---|---|
| | -0.1 | 0 | +0.1 | +0.2 | +0.3 |
| 30 | 106.4 | 105.5 | 106.7 | 106.8 | 103.2 |
| 31 | 95.0 | 94.5 | 96.0 | 95.1 | X |
| 32 | 93.2 | 85.2 | 85.7 | X | X |
| 33 | 80.4 | 77.2 | X | X | - |
| 34 | 73.1 | 70.4 | - | - | - |

CD value (nm)
(colored box: condition causing pattern collapse,
X: CD value unmeasurable)

Also in Table 4, the colored box represents that the pattern collapse occurred under that condition. In Comparative Example 4, the pattern collapse occurred under part of the conditions of the dose amount of 31 mJ or more, and the area of the condition at which the pattern collapse occurred increased more than in Comparative Example 3. Further, under part of the conditions of the dose amount of 31 mJ or more, the pattern collapse was prominent and the CD value could not be measured depending on the condition (indicated with "X").

Comparing Table 2 to Table 4, it is obvious that the pattern collapse can be prevented more in Example 2 than in Comparative Example 3, Comparative Example 4. This is because TMSDMA replaces H of the OH group on the surface of the resist pattern with the silyl group to increase the hydrophobic property, thereby increasing the contact angle θ with respect to the rinse solution at the pattern and decreasing the maximum stress $\sigma_{MAX}$ on the pattern as descried above.

Note that also when the treatment solution made by diluting TMSDMA at a mixture ratio of HFE:TMSDMA=300:1 was used for carrying out Example 1, Example 2, almost the same effects as those of Example 1, Example 2 were able to be obtained.

On the other hand, when the mixture ratio (concentration) of TMSDMA in the treatment solution was made to be higher than about HFE:TMSDMA=100:1, the effect of preventing the pattern collapse is never improved and the cost of the treatment solution increases. This is because TMSDMA itself has the property of dissolving the resist, and TMSDMA is an expensive chemical.

Accordingly, the mixture ratio of the treatment solution capable of preventing the pattern collapse and suppressing an incase in cost is preferably within a range of about HFE:TMSDMA=100:1 to HFE:TMSDMA=300:1.

A preferred embodiments of the present invention has been described above, but the present invention is not limited to the embodiment. The present invention can be variously changed and modified within the scope of the present invention as set forth in claims.

EXPLANATION OF CODES

1 coating and developing treatment system
15 rinse nozzle
16 treatment solution nozzle
29 resist pattern
31 developing solution supply mechanism
32 rinse solution supply mechanism
33 treatment solution supply mechanism
36 developing solution nozzle
41 developing solution
42 rinse solution
43 treatment solution
52 spin chuck

What is claimed:

1. A developing treatment method, comprising:
   a treatment solution supplying step of supplying a treatment solution made by diluting a hydrophobizing agent hydrophobizing a resist pattern with hydrofluoroether onto a substrate on which a rinse solution has been supplied after development of the resist pattern, wherein the hydrophobizing agent is trimethylsilvidimethylamine;
   a treatment solution removing step of removing the treatment solution from a top of the substrate on which the treatment solution has been supplied; and
   after said treatment solution supplying step and before said treatment solution removing step,
   a hydrophobic treatment stabilizing step of stabilizing a hydrophobic treatment of the resist pattern with the supply of the treatment solution stopped and rotation of the substrate almost stopped.

2. The developing treatment method as set forth in claim 1, wherein said treatment solution removing step is performed while a rinse solution is supplied onto the substrate.

3. A developing treatment method, comprising:
   a treatment solution supplying step of supplying a treatment solution made by diluting a hydrophobizing agent hydrophobizing a resist pattern with hydrofluoroether onto a substrate on which a rinse solution has been supplied after development of the resist pattern;
   a treatment solution removing step of removing the treatment solution from a top of the substrate on which the treatment solution has been supplied; and
   after said treatment solution supplying step and before said treatment solution removing step, a hydrophobic treatment stabilizing step of stabilizing a hydrophobic treatment of the resist pattern with the supply of the treatment solution stopped and rotation of the substrate almost stopped, wherein said treatment solution supplying step comprises:
a first supplying step of supplying the treatment solution onto the substrate while rotating the substrate at a first number of rotations;
after said first supplying step, a second supplying step of supplying the treatment solution onto the substrate while rotating the substrate at a second number of rotations higher than the first number of rotations; and
after said second supplying step, a third supplying step of supplying the treatment solution onto the substrate while rotating the substrate at a third number of rotations lower than the second number of rotations.

4. The developing treatment method as set forth in claim 3, further comprising:
before said treatment solution supplying step,
a rinse solution supplying step of supplying the rinse solution onto the substrate while rotating the substrate at a fourth number of rotations lower than the first number of rotations.

5. The developing treatment method as set forth in claim 4, wherein said treatment solution removing step comprises:
a first removing step of removing the treatment solution from the top of the substrate while rotating the substrate at a fifth number of rotations; and
after said first removing step, a second removing step of removing the treatment solution from the top of the substrate while rotating the substrate at a sixth number of rotations higher than the fifth number of rotations.

6. The developing treatment method as set forth in claim 3, wherein said treatment solution removing step is performed while a rinse solution is supplied onto the substrate.

7. A developing treatment method, comprising:
a treatment solution supplying step of supplying a treatment solution made by diluting a hydrophobizing agent hydrophobizing a resist pattern with hydrofluoroether onto a substrate on which a rinse solution has been supplied after development of the resist pattern; and
a treatment solution removing step of removing the treatment solution from a top of the substrate on which the treatment solution has been supplied;
wherein the hydrophobizing agent is trimethylsilyldimethyl-amine.

8. The developing treatment method as set forth in claim 7, wherein said treatment solution removing step is performed while a rinse solution is supplied onto the substrate.

9. A developing treatment method, comprising:
a treatment solution supplying step of supplying a treatment solution made by diluting a hydrophobizing agent hydrophobizing a resist pattern with hydrofluoroether onto a substrate on which a rinse solution has been supplied after development of the resist pattern; and
a treatment solution removing step of removing the treatment solution from a top of the substrate on which the treatment solution has been supplied,
wherein said treatment solution supplying step comprises:
a first supplying step of supplying the treatment solution onto the substrate while rotating the substrate at a first number of rotations;
after said first supplying step, a second supplying step of supplying the treatment solution onto the substrate while rotating the substrate at a second number of rotations higher than the first number of rotations; and
after said second supplying step, a third supplying step of supplying the treatment solution onto the substrate while rotating the substrate at a third number of rotations lower than the second number of rotations.

10. The developing treatment method as set forth in claim 9, further comprising:
before said treatment solution supplying step,
a rinse solution supplying step of supplying the rinse solution onto the substrate while rotating the substrate at a fourth number of rotations lower than the first number of rotations.

11. The developing treatment method as set forth in claim 10,
wherein said treatment solution removing step comprises:
a first removing step of removing the treatment solution from the top of the substrate while rotating the substrate at a fifth number of rotations; and
after said first removing step, a second removing step of removing the treatment solution from the top of the substrate while rotating the substrate at a sixth number of rotations higher than the fifth number of rotations.

12. The developing treatment method as set forth in claim 9,
wherein said treatment solution removing step is performed while a rinse solution is supplied onto the substrate.

* * * * *